United States Patent
Hsu et al.

(10) Patent No.: US 10,163,751 B2
(45) Date of Patent: Dec. 25, 2018

(54) HEAT TRANSFER STRUCTURES AND METHODS FOR IC PACKAGES

(71) Applicant: TAIWAN SEMICONDUCTOR MANUFACTURING COMPANY, LTD., Hsinchu (TW)

(72) Inventors: Ying-Chih Hsu, Hsinchu (TW); Alan Roth, Leander, TX (US); Chuei-Tang Wang, Taichung (TW); Chih-Yuan Chang, Hsinchu (TW); Eric Soenen, Austin, TX (US); Chih-Lin Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/658,948

(22) Filed: Jul. 25, 2017

(65) Prior Publication Data
US 2018/0151466 A1    May 31, 2018

Related U.S. Application Data

(60) Provisional application No. 62/427,681, filed on Nov. 29, 2016.

(51) Int. Cl.
*H01L 23/367* (2006.01)
*H01L 21/48* (2006.01)
(Continued)

(52) U.S. Cl.
CPC ........ *H01L 23/3677* (2013.01); *H01L 21/486* (2013.01); *H01L 23/481* (2013.01); *H01L 23/49822* (2013.01)

(58) Field of Classification Search
CPC .............. H01L 23/3677; H01L 23/481; H01L 23/49822
See application file for complete search history.

(56) References Cited

U.S. PATENT DOCUMENTS

2007/0205495 A1  9/2007  Fernandez et al.
2008/0315396 A1  12/2008  Kuhlman et al.
(Continued)

FOREIGN PATENT DOCUMENTS

TW    200830524    7/2008
TW    201225762    6/2012

OTHER PUBLICATIONS

Office Action dated Sep. 26, 2018 from corresponding application No. TW 106136007.

*Primary Examiner* — Daniel Shook
(74) *Attorney, Agent, or Firm* — Hauptman Ham, LLP

(57) ABSTRACT

A package structure includes a first package layer, a second package layer, and a chip layer positioned between the first package layer and the second package layer. The first package layer includes an electrical signal structure electrically isolated from a first thermal conduction structure. The chip layer includes an integrated circuit (IC) chip electrically connected to the electrical signal structure, a molding material, and a through-via positioned in the molding material. The first thermal conduction structure, the through-via, and the second thermal conduction structure are configured as a low thermal resistance path from the IC chip to a surface of the second package layer opposite the chip layer.

15 Claims, 9 Drawing Sheets

(51) Int. Cl.
*H01L 23/48* (2006.01)
*H01L 23/498* (2006.01)

(56) References Cited

U.S. PATENT DOCUMENTS

2013/0093073 A1    4/2013  Chen et al.
2015/0102499 A1*  4/2015  Coullomb ........... H01L 23/3677
                                                    257/774

* cited by examiner

HEAT TRANSFER STRUCTURES AND METHODS FOR IC PACKAGES

BACKGROUND

In integrated circuit (IC) chips and packages, heat is generated by current flowing through various circuits and electrical connections. Dissipation of the generated heat to the surrounding environment allows operating temperatures of the various circuits to remain within specified temperature ranges.

Heat dissipation depends on a number of factors including the location of a heat source and the thermal conductivities of structural elements between the heat source and the surrounding environment. Often, materials that have relatively low electrical conductivity have relatively low thermal conductivity, and materials that have relatively high electrical conductivity have relatively high thermal conductivity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
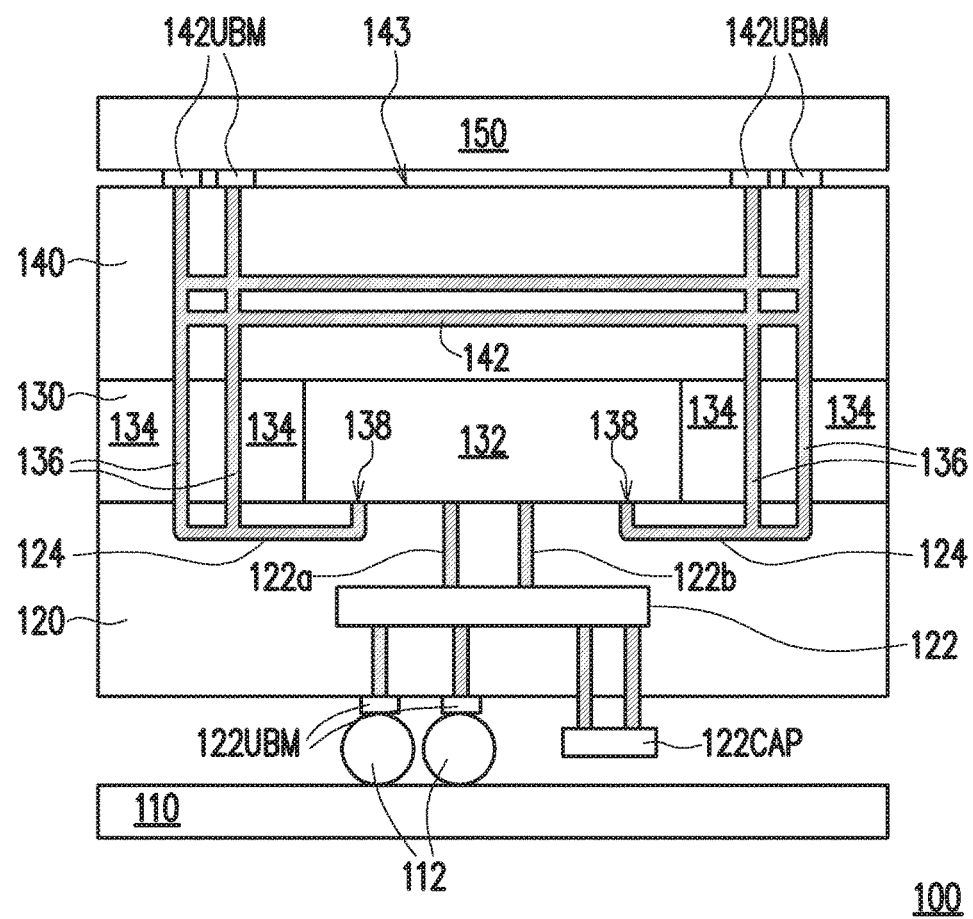
FIG. 1 is a diagram of a package structure, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package structure includes a first package layer in which an electrical signal structure is electrically isolated from a first thermal conduction structure. A second package layer includes a second thermal conduction structure, and a chip layer is positioned between the first package layer and the second package layer. The chip layer includes an IC chip electrically connected to the electrical signal structure, a molding material, and a through-via positioned in the molding material. The first thermal conduction structure, the through-via, and the second thermal conduction structure are configured as a low thermal resistance path from the IC chip to a surface of the second package layer opposite the chip layer. In other words, the first thermal conduction structure, the through-via, and the second thermal conduction structure are configured as a high thermal conductance path from the IC chip to a surface of the second package layer opposite the chip layer.

An IC structure includes a first device and a second device, the second device being thermally coupled to the first device by a low thermal resistance substrate path or a high thermal conductance substrate path. An electrical signal path extends from the first device to a top surface of the IC chip, a low thermal resistance path extends from the second device to the top surface of the IC chip, and the low thermal resistance path is electrically isolated from the electrical signal path.

FIG. 1 is a side-view diagram of a package structure 100, in accordance with some embodiments. Package structure 100 includes a printed circuit board (PCB) 110, a first package layer 120 overlying PCB 110, a chip layer 130 overlying first package layer 120, a second package layer 140 overlying chip layer 130, and a heat spreader 150 overlying second package layer 140. First package layer 120 includes an electrical signal structure 122 and a first thermal conduction structure 124. Chip layer 130 includes an IC chip 132, a molding material 134, and through-vias 136. Second package layer 140 includes a second thermal conduction structure 142.

In some embodiments, package structure 100 does not include PCB 110. In some embodiments, package structure 100 does not include heat spreader 150. In some embodiments, package structure 100 is part of an IC package that includes one or more layers in addition to first package layer 120, chip layer 130, and second package layer 140. In some embodiments, package structure 100 is part of an IC package that includes one or more IC chips (not shown) in addition to IC chip 132. In some embodiments, package structure 100 is part of an IC package that includes one or more heat spreaders (not shown) in addition to heat spreader 150. In some embodiments, package structure 100 is part of an integrated fan-out (InFO) package.

PCB 110 is configured to provide one or more electrical connections between electrical signal structure 122 and one or more additional electrical signal structures and/or one or more electrical structures external to an IC package comprising IC package structure 100. In some embodiments, PCB 110 is electrically connected to first package layer 120 by two electrical connectors 112. In various embodiments, electrical connectors 112 are solder balls, conductive pillars, or other suitable conductive elements capable of providing electrical connections from PCB 110 to electrical signal structure 122. In at least some embodiments, there are greater or lesser number of electrical connectors 112.

First package layer 120 includes one or more dielectric layers (not shown) that are part of an IC package comprising IC package structure 100. Electrical signal structure 122 and first thermal conduction structure 124 are within the one or more dielectric layers (not shown) of first package layer 120.

Electrical signal structure 122 is configured to provide electrical connections between IC chip 132 and PCB 110. In some embodiments, electrical signal structure 122 is configured to provide electrical connections between IC chip 132 and one or more additional IC chips (not shown). In some embodiments, electrical signal structure 122 is configured to provide electrical connections between IC chip 132 and one or more PCBs (not shown) other than PCB 110.

Electrical signal structure 122 includes electrically conductive elements positioned within the one or more dielectric layers (not shown) of first package layer 120. In some embodiments, electrically conductive elements of electrical signal structure 122 are redistribution lines positioned within the one or more dielectric layers. Electrically conductive elements of electrical signal structure 122 comprise one or more conductive materials such as a metal, a metal composite, or other suitable material that is formed in one or more metallization layers by one or more of a physical vapor deposition process, a chemical vapor deposition process, a plating process, or other suitable process.

In some embodiments, electrical signal structure 122 includes one or more resistive devices, also referred to as resistors. In some embodiments, electrical signal structure 122 includes one or more energy storage devices, examples of which include inductive devices or capacitive devices, or the like.

In some embodiments, electrical signal structure 122 is a component of an integrated voltage regulator (IVR). In some embodiments, electrical signal structure 122 is a component of an IVR and includes an inductive device. In some embodiments, electrical signal structure 122 is a component of an IVR and includes a plurality of inductive devices, each inductive devices of the plurality of inductive devices corresponding to a phase of the IVR. In some embodiments, a plurality of inductive devices includes 16 inductors. In some embodiments, the plurality of inductive devices includes greater or fewer numbers of inductive devices.

In the embodiment depicted in FIG. 1, electrical signal structure 122 includes elements entirely within the one or more dielectric layers (not shown) and additional elements outside the one or more dielectric layers (not shown). In some embodiments, electrical signal structure 122 does not include additional elements outside the one or more dielectric layers (not shown).

In the embodiment depicted in FIG. 1, the additional elements of electrical signal structure 122 include under-bump metallurgies (UBMs) 122UBM. Each UBM 122UBM is positioned between electrical signal structure 122 and an electrical connector 112 and is configured to provide an electrical connection and/or a mechanical connection between electrical signal structure 122 and the electrical connector 112. In some embodiments, one or more UBMs (not shown) in addition to UBMs 122UBM are electrically separate from electrical signal structure 122 and are configured to provide a mechanical connection between first package layer 120 and electrical connectors 112.

In the embodiment depicted in FIG. 1, the additional elements of electrical signal structure 122 include a capacitor 122CAP. In some embodiments, capacitor 122CAP has a capacitance value in a range from 100 nanoFarads (nF) to 1000 nF. In some embodiments, capacitor 122CAP has a capacitance value of approximately 700 nF.

First thermal conduction structure 124 is configured to provide a low thermal resistance path from IC chip 132 to through-vias 136. First thermal conduction structure 124 is electrically isolated from electrical signal structure 122. In some embodiments, first thermal conduction structure 124 is a single, continuous structure within first package layer 120. In some embodiments, first thermal conduction structure 124 includes a plurality of separate structures within first package layer 120, each of which provides a low thermal resistance path from IC chip 132 to through-vias 136. The reciprocal of thermal resistance (or resistivity) is thermal conductance (or conductivity). For example, in some embodiments, a low thermal resistance path is also a high thermal conductance path. Similarly, in some embodiments, a high thermal resistance path is also a low thermal conductance path. In some embodiments, a structure with a high thermal conductance has a thermal conductivity (at 298 degrees Kelvin) greater than or equal to 2 (W/m-K). In some embodiments, a structure with a low thermal resistance has a thermal resistance less than or equal to 0.5 (m-K/W).

In some embodiments, package structure 100 includes one or more IC chips (not shown) in addition to IC chip 132, and first thermal conduction structure 124 is configured to provide one or more low thermal resistance paths from the one or more additional IC chips (not shown) to through-vias 136.

First thermal conduction structure 124 includes thermally conductive elements positioned within the one or more dielectric layers of first package layer 120. Thermally conductive elements of first thermal conduction structure 124 comprise one or more materials such as a metal, a metal composite, a non-metal composite, a polymer, an amalgam, or other suitable material that is formed in one or more layers by one or more of a physical vapor deposition process, a chemical vapor deposition process, a plating process, or other suitable process. In some embodiments, a metal or metal alloy includes one or more of copper, copper alloy, aluminum, gold or other suitable materials.

In some embodiments, one or more layers of thermally conductive elements of first thermal conduction structure 124 are also described as redistribution lines (RDLs), post-passivation interconnect (PPI) structures, or package metallization (PM) stacks positioned within the one or more dielectric layers (not shown) of first package layer 120. In some embodiments, thermally conductive elements of first thermal conduction structure 124 are part of an InFO package.

In the embodiment depicted in FIG. 1, package structure 100 includes two locations at which low thermal resistance interfaces 138 are present between IC chip 132 and first thermal conduction structure 124. In some embodiments, package structure 100 includes a single location at which a low thermal resistance interface 138 is present between IC chip 132 and first thermal conduction structure 124. In some embodiments, package structure 100 includes more than two locations at which low thermal resistance interfaces 138 are present between IC chip 132 and first thermal conduction structure 124.

A low thermal resistance interface 138 is configured to thermally couple a thermally conductive element of IC chip 132 to a thermally conductive element of first thermal conduction structure 124. In some embodiments, a low thermal resistance interface 138 is a direct contact between a thermally conductive element of IC chip 132 and a thermally conductive element of first thermal conduction structure 124. In some embodiments, a low thermal resistance interface 138 includes one or more additional elements between a thermally conductive element of IC chip 132 and a thermally conductive element of first thermal conduction structure 124. In some embodiments, one or more additional elements have low thermal conductivity relative to a thermally conductive element of first thermal conduction structure 124, but have a sufficiently large cross-sectional area and/or a sufficiently small thickness to provide a low thermal resistance path between IC chip 132 and first thermal conduction structure 124.

In the embodiment depicted in FIG. 1, each of two portions of first thermal conduction structure 124 includes a single line segment extending from a single low thermal resistance interface 138 to two through-vias 136. In some embodiments, a single line segment of first thermal conduction structure 124 corresponds to a plurality of low thermal resistance interfaces 138. In some embodiments, a single line segment of first thermal conduction structure 124 corresponds to a single through-via 136. In some embodiments, a single line segment of first thermal conduction structure 124 corresponds to more than two through-vias 136.

In some embodiments, a plurality of line segments of first thermal conduction structure 124 corresponds to a single low thermal resistance interface 138. In some embodiments, a plurality of line segments of first thermal conduction structure 124 corresponds to a plurality of low thermal resistance interfaces 138.

In some embodiments, a plurality of line segments of first thermal conduction structure 124 corresponds to a single through-via 136. In some embodiments, a plurality of line segments of first thermal conduction structure 124 corresponds to a plurality of through-vias 136.

In some embodiments, first thermal conduction structure 124 includes a plurality of parallel line segments. In some embodiments, first thermal conduction structure 124 includes a plurality of line segments in a grid arrangement. In some embodiments, first thermal conduction structure 124 includes a plurality of line segments in a single dielectric layer of first package layer 120. In some embodiments, first thermal conduction structure 124 includes a plurality of line segments in multiple dielectric layers of first package layer 120.

IC chip 132 is a device die that includes one or more processors, voltage regulators, voltage converters, logic circuits, power management ICs, transmitters, receivers, memories, other IC circuits, or the like. IC chip 132 includes one or more electrical signal paths (not shown) configured to electrically connect to electrical signal structure 122 by conductive lines 122a, 122b. IC chip 132 further includes one or more low thermal resistance paths (not shown) configured to thermally connect to low thermal resistance interfaces 138, described above with respect to first thermal conduction structure 124. In some embodiments, one or more low thermal resistance paths include an opening in a passivation layer (not shown) of IC chip 132.

Molding material 134 is positioned between first package layer 120 and second package layer 140 and fills some or all of the volume between first package layer 120 and second package layer 140 that is not occupied by IC chip 132 and through-vias 136. In some embodiments, package structure 100 includes one or more IC chips in addition to IC chip 132, and molding material 134 fills some or all of the volume between first package layer 120 and second package layer 140 that is not occupied by IC chip 132, through-vias 136, and the additional one or more IC chips. In some embodiments, molding material 134 is electrically insulating. In some embodiments, the molding material 134 is configured to provide package stiffness, provide a protective or hermetic cover, provide shielding, and/or provide a heat conductive path.

Molding material 134 includes a molding compound, a molding underfill, an epoxy, a resin, or another suitable material capable of filling some or all of the otherwise unoccupied volume between first package layer 120 and second package layer 140.

Through-vias 136 include thermally conductive elements positioned within molding material 134 and extending from first package layer 120 to second package layer 140. Thermally conductive elements of through-vias 136 comprise one or more materials such as a metal, a metal composite, a non-metal composite, a polymer, an amalgam, or other suitable material that is formed in one or more layers by one or more of a physical vapor deposition process, a chemical vapor deposition process, a plating process, or other suitable process.

In some embodiments, through-vias 136 are metal pillars. In some embodiments, through-vias 136 comprise copper, copper alloy, aluminum, gold or other suitable thermally conductive materials. In some embodiments, through-vias 136 comprise a seed metal. In some embodiments, through-vias 136 are through integrated fan-out vias (TIVs) of an InFO package.

In the embodiment depicted in FIG. 1, a plurality of through-vias includes four through-vias 136. In some embodiments, chip layer 130 includes a single through-via 136. In some embodiments, a plurality of through-vias includes fewer than four through-vias 136. In some embodiments, a plurality of through-vias includes more than four through-vias 136. In some embodiments, a plurality of through-vias includes two or more through-vias 136 configured in a parallel orientation.

In some embodiments, chip layer 130 includes one or more through-vias 136 adjacent to each of one or more edges of a perimeter of IC chip 132. In some embodiments, chip layer 130 includes one or more through-vias 136 adjacent to each of four edges of a perimeter of IC chip 132. In some embodiments, chip layer 130 includes one or more IC chips in addition to IC chip 132, and one or more through-vias 136 are positioned between IC chip 132 and the one or more additional IC chips.

Second package layer 140 includes one or more dielectric layers that are part of an IC package comprising IC package structure 100. Second package layer 140 includes a surface 143 opposite chip layer 130.

Second thermal conduction structure 142 is formed within the one or more dielectric layers of second package layer 140 and extends from chip layer 130 to the surface 143. Second thermal conduction structure 142 is configured to provide a low thermal resistance path from through-vias 136 to surface 143, and includes UBMs 142UBM at surface 143. In some embodiments, second thermal conduction structure 142 does not include UBMs 142UBM. In some embodiments, second thermal conduction structure 142 is a heat sink.

In some embodiments, second thermal conduction structure 142 is a single, continuous structure within second package layer 140. In some embodiments, second thermal conduction structure 142 includes a plurality of separate structures within second package layer 140, each of which provides a low thermal resistance path from one or more through-vias 136 to surface 143.

Second thermal conduction structure 142 includes thermally conductive elements that comprise one or more materials such as a metal, a metal composite, a non-metal composite, a polymer, an amalgam, or other suitable material that is formed in one or more layers by one or more of a physical vapor deposition process, a chemical vapor deposition process, a plating process, or other suitable process.

In some embodiments, one or more layers of thermally conductive elements of second thermal conduction structure 142 are also described as redistribution lines, post-passivation interconnect structures, or package metallization stacks positioned within the one or more dielectric layers of second package layer 140. In some embodiments, thermally conductive elements of second thermal conduction structure 142 are part of an InFO package.

In the embodiment depicted in FIG. 1, second thermal conduction structure 142 extends from four through-vias 136 to two UBMs 142UBM at surface 143. In some embodiments, second thermal conduction structure 142 extends from fewer than four through-vias 136 to surface 143. In some embodiments, second thermal conduction structure 142 extends from more than four through-vias 136 to surface 143.

In some embodiments, second thermal conduction structure 142 extends to a single UBM 142 UBM. In some embodiments, second thermal conduction structure 142 extends to more than two UBMs 142 UBM.

In some embodiments, second thermal conduction structure 142 includes a plurality of parallel line segments. In some embodiments, second thermal conduction structure 142 includes a plurality of line segments in a grid arrangement. In some embodiments, second thermal conduction structure 142 includes a plurality of line segments in a single dielectric layer of second package layer 140. In some embodiments, second thermal conduction structure 142 includes a plurality of line segments in multiple dielectric layers of second package layer 140.

UBMs 142UBM are on the surface 143 of the second package layer 140. In some embodiments, one or more of UBMs 142UBM are configured to provide a mechanical connection between second package layer 140 and heat spreader 150. In some embodiments, at least one UBM of UBMs 142UBM or 122UBM is the same as another UBM of UBMs 142UBM or 122UBM. In some embodiments, at least one UBM of UBMs 142UBM or 122UBM is different from another UBM of UBMs 142UBM or 122UBM. In some embodiments, at least one UBM of UBMs 142UBM or 122UBM includes one or more of an adhesion layer, a barrier layer, a wetting layer or a seed layer. In some embodiments, at least one UBM of UBMs 142UBM or 122UBM is a solder bump, gold bump, copper pillar bump, bumps with mixed metals or other suitable materials.

Heat spreader 150 is a structure configured to form a low thermal resistance path between UBMs 142UBM and an ambient or external environment. In some embodiments, heat spreader 150 includes one or more fins (not shown), a mesh configuration (not shown), or other configuration by which a surface area of heat spreader is increased relative to a volume of heat spreader 150 such that heat transfer to the ambient environment is increased as compared to structures without such features.

Heat spreader 150 comprises one or more materials such as a metal, a metal composite, a non-metal composite, a polymer, an amalgam, or other suitable material that is capable of providing a low thermal resistance path to the ambient environment.

In some embodiments, package structure 100 includes one or more heat spreaders in addition to heat spreader 150, and each additional heat spreader is configured to provide a low thermal resistance path from one or more UBMs 142 UBM of second thermal conduction structure 142 to the ambient environment. In some embodiments, package structure 100 includes one or more heat spreaders in addition to heat spreader 150, and the one or more additional heat spreaders are configured to provide a low thermal resistance path from one or more thermal conduction structures other than second thermal conduction structure 142.

Package structure 100 is thereby configured such that first thermal conduction structure 124, through-vias 136, and second thermal conduction structure 142 are a low thermal resistance path from IC chip 132 to surface 143 and, if present, heat spreader 150. The low thermal resistance path therefore includes an interface with IC chip 132 on the same surface at which electrical signal structure 122 has an interface with IC chip 132, but is configured to conduct heat in a direction opposite the direction in which electrical signal structure 122 extends beyond the surface of IC chip 132.

Because first thermal conduction structure 124 is electrically isolated from electrical signal structure 122, the low thermal resistance path from IC chip 132 to surface 143 is electrically isolated from electrical signal paths in IC chip 132 as long as the one or more electrical signal paths (not shown) in IC chip 132 are electrically isolated from low thermal resistance interfaces 138.

In some embodiments, package structure 100 includes one or more chip layers in addition to chip layer 130 and one or more package layers in addition to first package layer 120 and second package layer 140, and the additional one or more chip layers and the additional one or more package layers include features similar to those discussed above with respect to chip layer 130, first package layer 120, and second package layer 140, such that one or more expanded and/or additional low thermal resistance paths to one or more package surfaces are provided.

The configuration of separate thermal and electrical signal paths from one or more IC chips to one or more surfaces of an IC package provides increased power efficiency compared to approaches in which thermal and electrical paths are combined. Compared to other approaches, the increased power efficiency enables more compact circuit configurations, thereby lowering costs and increasing capabilities for a given circuit size. For example, an integrated voltage regulator in a package structure in accordance with the various embodiments is capable of having an increased number of phases for a given circuit size compared to an integrated voltage regulator based on other approaches.

Figure 2:
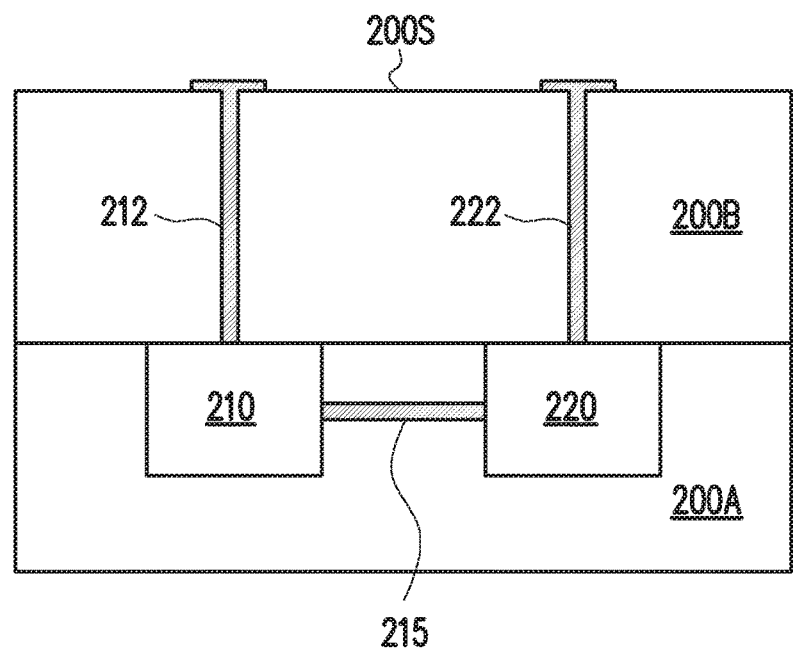
FIG. 2 is a diagram of an IC chip, in accordance with some embodiments.

FIG. 2 is a side view diagram of an IC chip 200, in accordance with some embodiments. IC chip 200 is usable as IC chip 132, described above with respect to package structure 100 and FIG. 1. IC chip 200 in FIG. 2 is depicted having a vertical orientation opposite the vertical orientation of IC chip 132 in FIG. 1. Accordingly, elements depicted as being positioned at a top surface of IC chip 200 in FIG. 2 are equivalent to elements depicted as being positioned at a bottom surface of IC chip 132 in FIG. 1.

IC chip 200 includes a substrate 200A and an interconnect layer 200B above substrate 200A. Substrate 200A includes a first device 210, a second device 220, and a low thermal resistance substrate path 215 between first device 210 and second device 220. Interconnect layer 200B includes an electrical signal path 212, a low thermal resistance path 222, and a surface 200S opposite substrate 200A.

Substrate 200A is a semiconductor substrate and components formed within and on the semiconductor substrate, including oxide diffusion, or active regions, source/drain regions, isolation structures, and transistor gate and fin structures.

First device 210 is a functional IC device formed in substrate 200A and second device 220 is a dummy device formed in substrate 200A. Non-limiting examples of first device 210 and second device 220 include transistors, diodes, resistive devices, or other suitable devices, or a combination of one or more such devices formed in substrate 200A. In some embodiments, one or both of first device 210 or second device 220 is formed in one or more wells (not shown) in substrate 200A.

Low thermal resistance substrate path 215 is a low thermal resistance path between first device 210 and second device 220 in substrate 200A. In some embodiments, first device 210 and second device 220 are adjacent to each other and low thermal resistance substrate path 215 is a portion of the semiconductor substrate 200A separating first device 210 from second device 220. Because of the proximity of first device 210 to second device 220, a small thickness of the portion of the semiconductor substrate 200A between first device 210 and second device 220 causes low thermal resistance substrate path 215 to have a low thermal resistance.

Low thermal resistance substrate path 215 is configured to electrically isolate first device 210 from second device 220. In some embodiments, low thermal resistance substrate path 215 is configured to electrically isolate first device 210 from second device 220 by including an inversion region at a p-n junction in substrate 200A. In some embodiments, low thermal resistance substrate path 215 includes a diode (not shown), first device 210 is electrically coupled to an anode of the diode, and second device 220 is electrically coupled to a cathode of the diode. In some embodiments, low thermal resistance substrate path 215 includes a diode, first device 210 is electrically coupled to a cathode of the diode, and second device 220 is electrically coupled to an anode of the diode. In some embodiments, low thermal resistance substrate path 215 includes a diode formed between a well in first device 210 (or second device 220) and semiconductor substrate 200A.

Electrical signal path 212 extends from first device 210 to surface 200S of interconnect layer 200B, and is configured to provide an electrical connection between first device 210 and surface 200S. Electrical signal path 212 includes a combination of one or more of contacts, vias, IC metallization layers from metal zero through another metal layer, and a pad layer.

Low thermal resistance path 222 extends from second device 220 to surface 200S of interconnect layer 200B, and is configured to provide a low thermal resistance path between second device 220 and surface 200S. Low thermal resistance path 222 includes a combination of one or more of contacts, vias, IC metallization layers from metal zero through another metal layer, and a pad layer. A combination of second device 220 and low thermal resistance path 222 is also called a vertical heat sink.

In the embodiment depicted in FIG. 2, IC chip 200 includes a single first device 210, a single electrical signal path 212, a single low resistance substrate path 215, a single second device 220, and a single low thermal resistance path 222. In some embodiments, IC chip 200 includes an additional one or more of at least one of first device 210, electrical signal path 212, low resistance substrate path 215, second device 220, and low thermal resistance path 222.

In some embodiments, a single electrical signal path 212 provides an electrical connection between surface 200S and one or more first devices in addition to first device 210. In some embodiments, a single low thermal resistance path 222 provides a low thermal resistance path between surface 200S and one or more second devices in addition to second device 220.

The configuration of separate thermal and electrical signal paths from multiple devices in an IC chip to a surface of the IC chip provides increased power efficiency compared to approaches in which a separate low thermal resistance path is not present. Compared to other approaches, the increased power efficiency enables more compact circuit configurations, thereby lowering costs and increasing capabilities for a given circuit size. A separate low thermal resistance path in an IC chip that is a part of a package having one or more low thermal resistance paths that are separate from electrical signal paths further enables compact circuit configurations at the package level.

Figure 3:
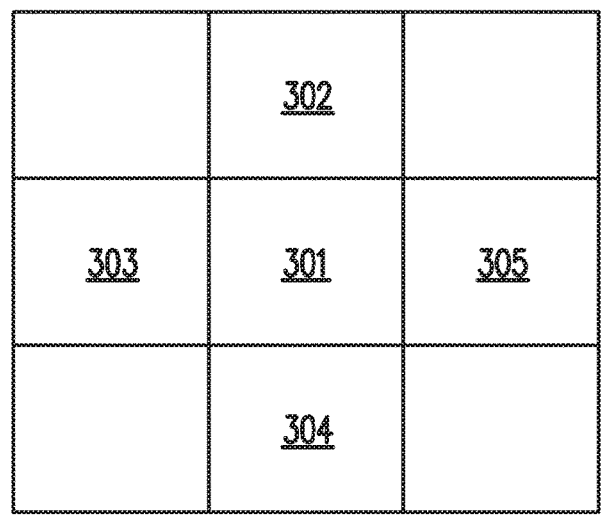
FIG. 3 is a diagram of an IC structure, in accordance with some embodiments.

FIG. 3 is a top view diagram of an IC structure 300, in accordance with some embodiments. FIG. 3 is an array of vertical heat sinks 301, 302, 303, 304 and 305. FIG. 3 depicts a horizontal layout in which a vertical heat sink 301 is surrounded by vertical heat sinks 302, 303, 304, and 305. Each of vertical heat sinks 301-305 corresponds to a combination of a second device 220 and low thermal resistance path 222, described above with respect to IC chip 200 and FIG. 2.

In some embodiments, IC structure 300 includes a subset of one or more of vertical heat sinks 301, 302, 303, 304, and 305. In some embodiments, IC structure 300 is one IC structure of a plurality of IC structures 300, and two or more of the plurality of IC structures 300 are part of a single, continuous, low thermal resistance structure.

The layout configuration of FIG. 3 in which one or more vertical heat sinks are optionally included enables design flexibility such that heat sink structures are capable of being configured in accordance with heat generation in adjacent functional circuits and requirements for electrical isolation. This design flexibility allows the number of vertical heat sinks, and therefore total heat flow, to be maximized near functional circuit elements that generate significant heat, and to be minimized near functional circuit elements that generate insignificant heat, thereby limiting space requirements.

Figure 4:
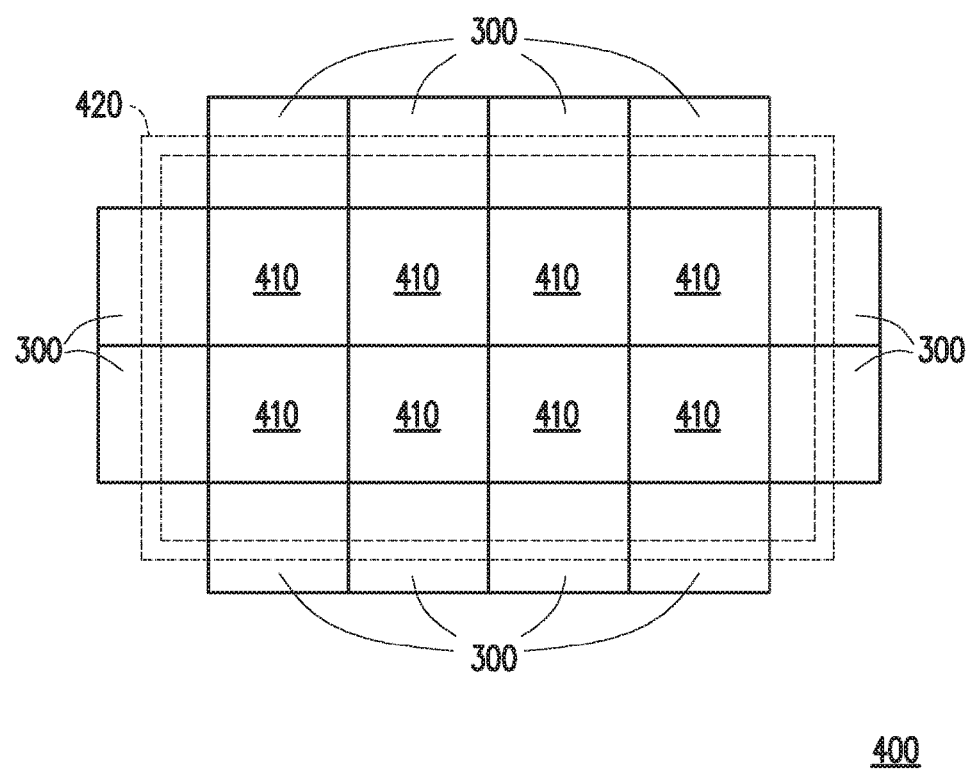
FIG. 4 is a diagram of an IC structure, in accordance with some embodiments.

FIG. 4 is a top view diagram of an IC structure 400, in accordance with some embodiments. FIG. 4 depicts a horizontal layout in which a plurality of IC structures 300, described above with respect to FIG. 3, surrounds a plurality of circuit components 410. A low thermal resistance path 420 thermally couples IC structures 300 to each other.

Circuit components 410 include functional circuit elements such as one or more first devices 210, described above with respect to IC structure 200 and FIG. 2. Low thermal resistance path 420 is formed from one or more metallization layers (not shown) from which one or more low resistance paths 222 are also formed such that low thermal resistance path 420 is a component of each IC structure 300.

In the embodiment depicted in FIG. 4, low thermal resistance path 420 is part of each IC structure 300 of the plurality of IC structures 300. In some embodiments, low thermal resistance path 420 is a part of a subset of the plurality of IC structures 300.

In the embodiment depicted in FIG. 4, the plurality of IC structures 300 includes twelve IC structures 300 and surrounds the plurality of circuit components 410 including eight circuit components 410. In some embodiments, IC structure 400 includes fewer than twelve IC structures 300. In some embodiments, IC structure 400 includes more than twelve IC structures 300. In some embodiments, IC structure 400 includes fewer than eight circuit components 410. In some embodiments, IC structure 400 includes more than eight circuit components 410. In some embodiments, the plurality of IC structures 300 does not surround the plurality of circuit components 410.

Because each IC structure 300 in IC structure 400 is capable of being populated with any or all of vertical heat sinks 301-305, IC structure 400 is capable of being configured to provide one or more low thermal resistance paths that match one or more locations at which heat is generated in the plurality of circuit components 410.

The layout configuration of FIG. 4 in which a plurality of configurable IC structures is combined with a plurality of circuit components enables design flexibility such that heat sink structures are capable of being configured in accordance with heat generation in adjacent functional circuits and requirements for electrical isolation.

Figure 5:
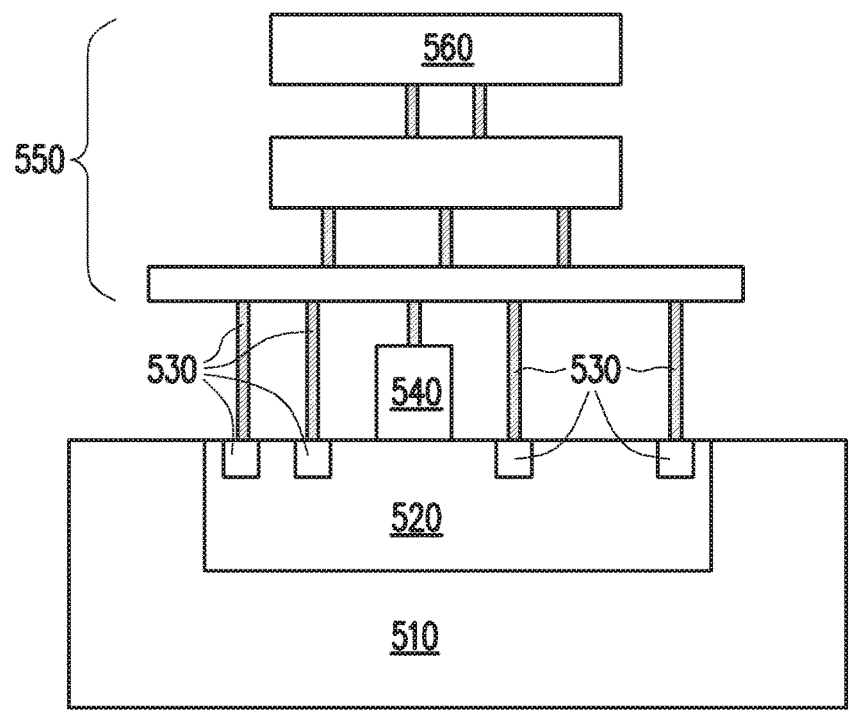
FIG. 5 is a diagram of an IC structure, in accordance with some embodiments.

FIG. 5 is a side view diagram of an IC structure 500, in accordance with some embodiments. IC structure 500 is usable as a vertical heat sink 301-305, described above with respect to IC structure 300 and FIG. 3. IC structure 500 includes a substrate region 510, a well 520, well connections 530, a gate structure 540, an interconnect structure 550, and a pad structure 560. In some embodiments, IC structure 500 does not include gate structure 540.

Substrate region 510 is a portion of a substrate in which one or more circuit components are formed, for example circuit component 410, described above with respect to IC structure 400 and FIG. 4. Substrate region 510 is a semiconductor having a first type of conductivity. In some embodiments, IC structure 500 is part of a complementary metal oxide semiconductor (CMOS) circuit in which substrate region 510 is configured to have a ground voltage level and one or more other substrate regions (not shown) are configured to be floating.

Well 520 is a portion of the substrate having a second type of conductivity opposite the first type of conductivity. In some embodiments, the first type of conductivity is p-type and the second type of conductivity is n-type. In some embodiments, the first type of conductivity is n-type and the second type of conductivity is p-type.

Well connections 530 are structures configured to electrically and/or thermally couple one or more portions of well 520 to one or more overlying structures. In various embodiments, well connections 530 include one or more of a source/drain region, a lightly-doped drain region, a source/drain contact, an emitter contact, a base contact, a collector contact, a well contact, or another suitable structure for electrically and/or thermally coupling one or more portions of well 520 to one or more overlying structures. In some embodiments, well structures 530 are at least electrically or thermally conductive structures.

Gate structure 540 is a portion of a semiconductor device configured to provide gate control of an underlying portion of substrate region 510. Gate structure 540 includes a dielectric layer and an overlying conductive gate.

Interconnect structure 550 is an IC structure that extends from well connections 530 to pad structure 560 and is configured to provide a low thermal and/or electrical resistance path from one or more of well connections 530 to pad structure 560. Interconnect structure 550 includes a combination of one or more of contacts, vias, and IC metallization layers from metal zero through another overlying metal layer. Interconnect structure 550 is positioned within one or more insulation layers overlying substrate 510. In some embodiments, interconnect structure 550 is physically and electrically isolated from other electrically conductive structures that overly substrate 510.

Pad structure 560 is an IC structure located at a top surface of the substrate that includes substrate region 510. Pad structure 560 includes a pad layer such as an aluminum layer for bond pad. In some embodiments, pad structure 560 includes a UBM layer. In some embodiments, pad structure 560 is a thermally conductive or an electrically conductive structure. In some embodiments, pad structure 560 is a metal, a metal composite, a non-metal composite, a polymer, an amalgam, or other suitable material that is formed in one or more layers by one or more of a physical vapor deposition process, a chemical vapor deposition process, a plating process, or other suitable process.

In some embodiments, well 520, well connections 530, gate structure 540, and interconnect structure 550 are configured as a dummy transistor in which interconnect structure 550 is electrically connected to each of well 520, well connections 530, and gate structure 540. In some embodiments, well 520, well connections 530, gate structure 540, and interconnect structure 550 are configured as a dummy field-effect transistor (FET). In some embodiments, well 520, well connections 530, gate structure 540, and interconnect structure 550 are configured as a dummy p-type metal oxide semiconductor (PMOS) transistor or a dummy n-type metal oxide semiconductor (NMOS) transistor.

The configuration of IC structure 500 enables the formation of a low thermal resistance path from a well 520 within a substrate region 510 to an overlying pad structure 560. This configuration enables the benefits of a separate low thermal resistance path described above by using IC structural elements and processes that are also used to form functional circuit elements. The benefits are thereby achieved without the need for additional structural designs or processes.

Figure 6:
FIG. 6 is a diagram of an IC structure, in accordance with some embodiments

FIG. 6 is a schematic diagram of an IC structure 600, in accordance with some embodiments. IC structure 600 is a schematic representation of a dummy transistor usable as IC structure 500, described above with respect to FIG. 5.

IC structure 600 includes a gate terminal coupled to a bulk terminal of the dummy transistor. IC structure 600 further includes a source terminal coupled to the drain terminal of the dummy transistor. IC structure 600 is configured as a PMOS dummy transistor. In some embodiments, IC structure 600 is configured as an NMOS dummy transistor. Other configurations of the source, drain, gate or bulk terminals of dummy transistor of IC structure 600 are within the scope of the present disclosure.

Figure 7:
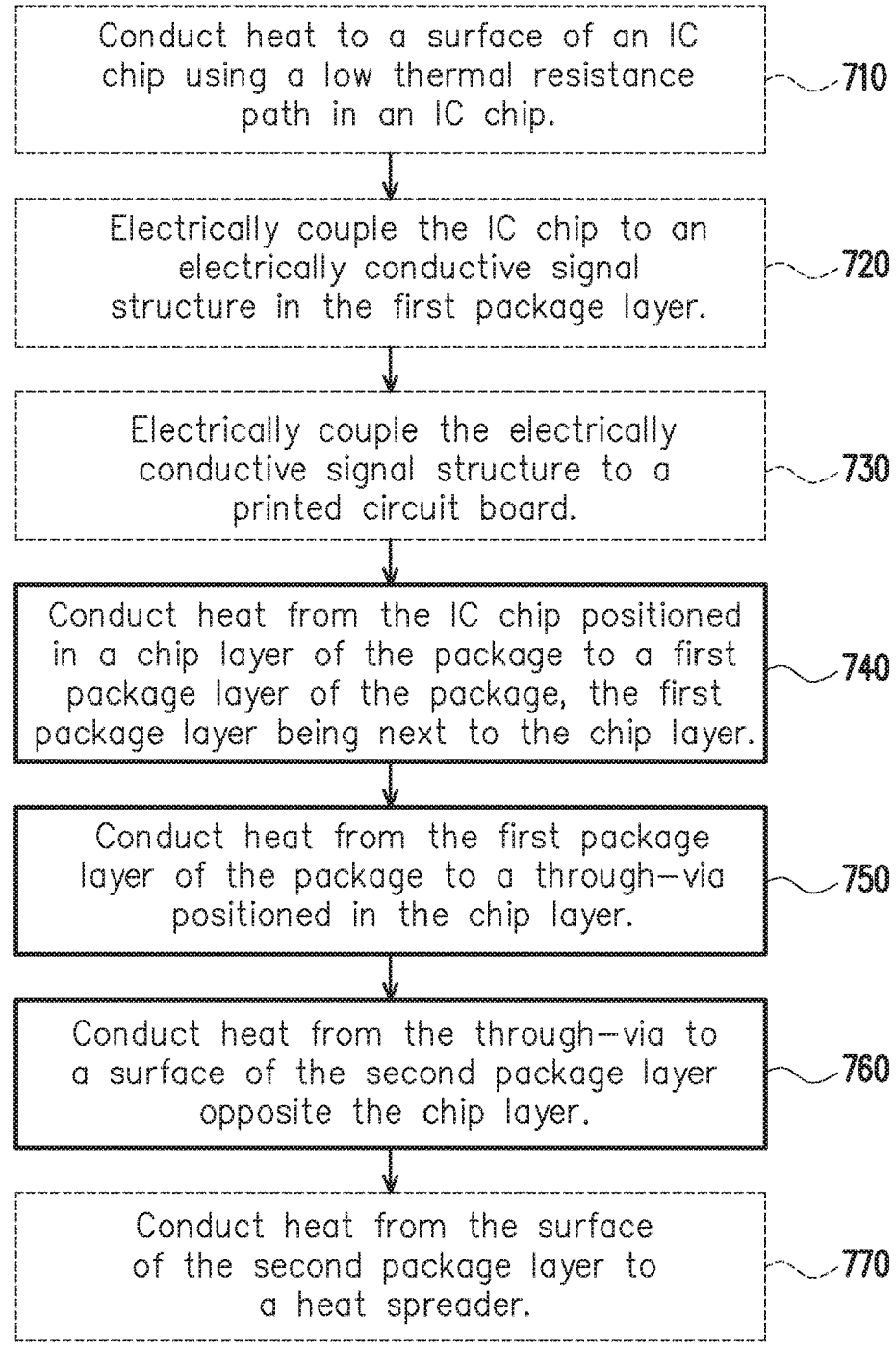
FIG. 7 is a flowchart of a method of transferring heat in a package, in accordance with some embodiments.

FIG. 7 is a flowchart of a method 700 of transferring heat in a package, in accordance with one or more embodiments. In some embodiments, method 700 is implemented to transfer heat in one or more of IC structures 100, 200, 300, 400, 500, or 600, discussed above. In some embodiments, transferring heat in the package includes transferring heat in an InFO package. In some embodiments, operations in addition to those depicted in FIG. 7 are performed before, between and/or after the operations depicted in FIG. 7.

At operation 710, in some embodiments, heat is conducted to a surface of an IC chip using a low thermal resistance path in the IC chip. In some embodiments, the low thermal resistance path is electrically isolated from one or more electrical signal paths in the IC chip.

In some embodiments, operation 710 includes conducting heat using a low thermal resistance path in IC chip 132, described above with respect to package structure 100 and FIG. 1. In some embodiments, operation 710 includes conducting heat using method 800, described below with respect to FIG. 8.

At operation 720, the IC chip is electrically coupled to an electrically conductive signal structure in the first package layer. In some embodiments, electrically coupling the IC chip to the electrically conductive signal structure in the first package layer of operation 720 includes sending a voltage signal or a current signal to the electrically conductive signal structure.

In some embodiments, electrically coupling the IC chip to the electrically conductive signal structure of operation 720 includes electrically coupling IC chip 132 to the electrically conductive signal structure 122, described above with respect to package structure 100 and FIG. 1.

At operation 730, the electrically conductive signal structure is electrically coupled to a printed circuit board attached to a surface of the first package layer opposite the chip layer. In some embodiments, electrically coupling the electrically conductive signal structure to the printed circuit board of operation 730 includes sending a voltage signal or a current signal to the printed circuit board.

In some embodiments, electrically coupling the electrically conductive signal structure to the printed circuit board of operation 730 includes electrically coupling the electrically conductive signal structure 122 to the printed circuit board 110, described above with respect to package structure 100 and FIG. 1. In some embodiments, first thermal conduction structure 124 is electrically isolated from electrically conductive signal structure 122 in first package layer 120.

At operation 740, heat is conducted from an IC chip positioned in a chip layer of the package to a first package layer of the package. In some embodiments, the first package layer is next to the chip layer. In some embodiments, conducting heat to the first package layer of the package includes conducting heat to a first thermal conduction structure electrically isolated from electrical signal paths of the IC chip, the first thermal conduction structure being positioned in the first package layer.

In some embodiments, conducting heat to the first package layer of the package of operation 740 includes conducting heat from IC chip 132 to the first thermal conduction structure 124 of the first package layer 120, described above with respect to package structure 100 and FIG. 1.

At operation 750, heat is conducted from the first package layer of the package to a through-via positioned in the chip layer of the package. In some embodiments, conducting heat from the first package layer of the package to the through-via of operation 750 includes conducting heat from the first thermal conduction structure 124 to the through-via 136 positioned in the chip layer 130. In some embodiments, the through-via is one through-via of a plurality of through-vias, and conducting heat using the through-via includes conducting heat using each through-via of the plurality of through-vias.

In some embodiments, conducting heat from the first package layer of the package to the through-via of operation 750 includes conducting heat from first package layer 120 to through-via 136 positioned in chip layer 130 of package structure 100, described above with respect to package structure 100 and FIG. 1.

At operation 760, heat is conducted from the through-via to a surface of the second package layer opposite the chip layer. In some embodiments, conducting heat from the through-via to the surface of the second package layer of operation 760 includes conducting heat from the through-via to a second thermal conduction structure, and conducting heat from the second thermal conduction structure to the surface of the second package layer.

In some embodiments, conducting heat from the through-via 136 to the surface 143 of the second package layer 140 of operation 760 includes conducting heat from through via 136 to second thermal conduction structure 142, and conducting heat from second thermal conduction structure 142 to surface 143 of second package layer 140, described above with respect to package structure 100 and FIG. 1.

At operation 770, in some embodiments, heat is conducted from the surface of the second package layer to a heat spreader. In some embodiments, conducting heat from the surface of the second package layer to the heat spreader of operation 770 includes conducting heat from second thermal conduction structure 142 to heat spreader 150, described above with respect to package structure 100 and FIG. 1.

In some embodiments, performing some or all of operations 710 through 770 includes conducting heat using a combination of structures in which no structure components are used for transmitting electrical signals.

By transferring heat in a package using a low thermal resistance path separate from one or more electrical signal paths, method 700 enables operation with increased power efficiency compared to approaches in which heat is conducted without a separate thermal conduction path. Compared to other approaches, the increased power efficiency enables more compact circuit configurations, thereby lowering costs and increasing capabilities for a given circuit size.

Figure 8:
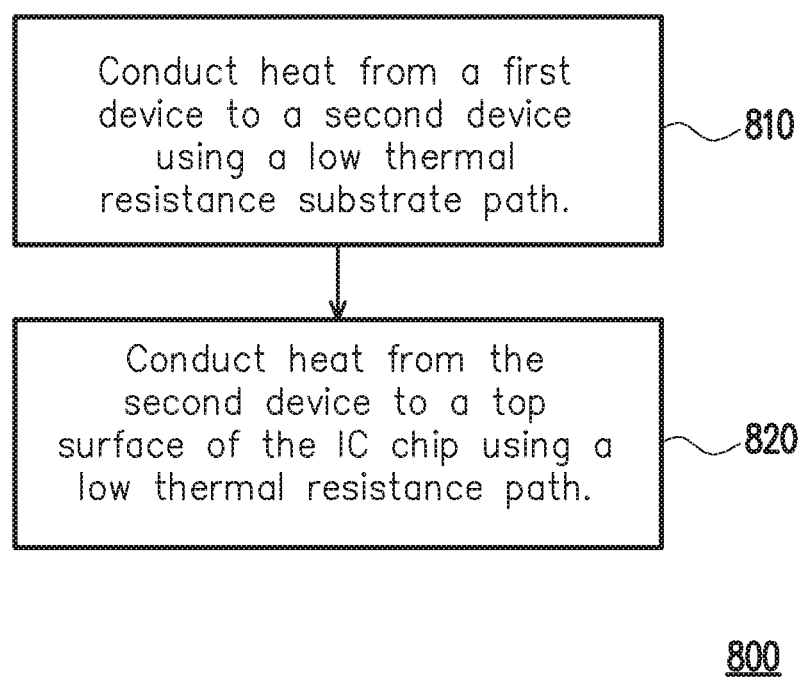
FIG. 8 is a flowchart of a method of transferring heat in an IC chip, in accordance with some embodiments.

FIG. 8 is a flowchart of a method 800 of transferring heat in an IC chip, in accordance with one or more embodiments. In some embodiments, method 800 is implemented to transfer heat in one or more of IC chip 132 or IC structures 200, 300, 400, 500, or 600, discussed above. In some embodiments, transferring heat in the IC chip includes transferring heat in an IC chip that is part of an InFO package. In some embodiments, operations in addition to those depicted in FIG. 8 are performed before, between and/or after the operations depicted in FIG. 8.

At operation 810, heat is conducted from a first device to a second device using a low thermal resistance substrate path. In some embodiments, the second device is one second device of a plurality of second devices, the low thermal resistance substrate path is one low thermal resistance substrate path of a plurality of low thermal resistance substrate paths, and conducting heat from the first device to the second device using the low thermal resistance substrate path of operation 810 includes conducting heat from first device to the plurality of second devices using the plurality of low thermal resistance substrate paths.

In some embodiments, conducting heat from the first device to the second device using the low thermal resistance substrate path of operation 810 includes conducting heat from first device 210 to second device 220 using low thermal resistance substrate path 215, described above with respect to IC structure 200 and FIG. 2. In some embodiments, conducting heat from the first device to the second device using the low thermal resistance substrate path of operation 810 includes conducting heat from circuit components 410 to IC structure 300, described above with respect to IC structures 300 and 400 and FIGS. 3 and 4.

At operation 820, heat is conducted from the second device to a top surface of the IC chip using a low thermal resistance path. In some embodiments, the low thermal resistance path of method 800 is electrically isolated from an electrical signal path that is electrically connected to the first device. In some embodiments, the low thermal resistance path is one low thermal resistance path of a plurality of low thermal resistance paths and conducting heat using the low thermal resistance path includes conducting heat using the plurality of low thermal resistance paths.

In some embodiments, conducting heat from the second device to the top surface of the IC chip using the low thermal resistance path of operation 820 includes conducting heat from second device 220 to top surface 200S using low thermal resistance path 222, described above with respect to IC structure 200 and FIG. 2. In some embodiments, conducting heat from the second device to the top surface of the IC chip using the low thermal resistance path of operation 820 includes conducting heat using one or more of vertical heat sinks 301-305, described above with respect to IC structure 300 and FIG. 3.

In some embodiments, conducting heat from the second device to the top surface of the IC chip using the low thermal resistance path of operation 820 includes conducting heat from substrate connections 530 to pad structure 560 using interconnect structure 540, described above with respect to IC structure 500 and FIG. 5. In some embodiments, conducting heat from the second device to the top surface of the IC chip using the low thermal resistance path of operation 820 includes conducting heat using IC structure 600, described above with respect to FIG. 6.

By transferring heat in an IC chip using a low thermal resistance path separate from one or more electrical signal paths, method 800 enables operation with increased power efficiency compared to approaches in which heat is conducted without a separate thermal conduction path. Compared to other approaches, the increased power efficiency enables more compact circuit configurations, thereby lowering costs and increasing capabilities for a given circuit size.

Figure 9:
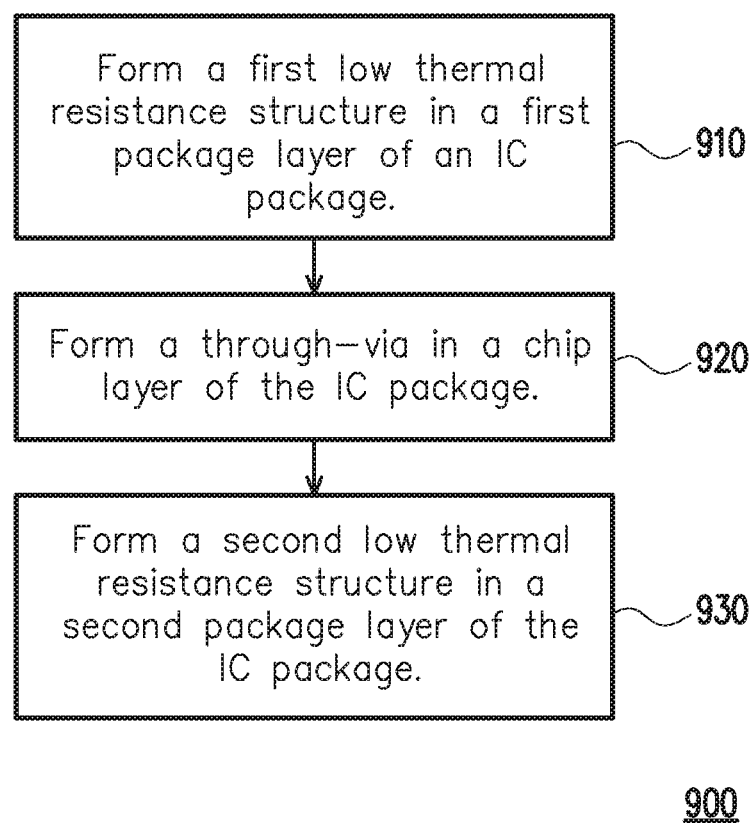
FIG. 9 is a flowchart of a method of forming a package structure, in accordance with some embodiments.

FIG. 9 is a flowchart of a method 900 of forming a package structure, in accordance with one or more embodiments. Method 900 is implemented to manufacture an IC package structure such as package structure 100, discussed above with respect to FIG. 1, and thereby obtains the benefits described above with respect to package structure 100.

The sequence in which the operations of method 900 are depicted in FIG. 9 is for illustration only; the operations of method 900 are capable of being executed in sequences that differ from that depicted in FIG. 9. In some embodiments, operations in addition to those depicted in FIG. 9 are performed before, between and/or after the operations depicted in FIG. 9.

At operation 910, a first low thermal resistance structure is formed in a first package layer of an IC package. Forming the first low thermal resistance structure of operation 910 includes forming the first low thermal resistance structure having a low thermal resistance interface to an IC chip of the IC package. Forming the first low thermal resistance structure of operation 910 includes forming the first low thermal resistance structure electrically isolated from one or more electrical signal paths in the first package layer.

In some embodiments, forming the first low thermal resistance structure in the first package layer of the IC package of operation 910 includes forming a first low thermal resistance structure in a first package layer of an InFO package.

In some embodiments, forming the first low thermal resistance structure in the first package layer of the IC package of operation 910 includes forming first low thermal resistance structure 124 in first package layer 120 of package structure 100, described above with respect to FIG. 1.

At operation 920, a through-via is formed in a chip layer of the IC package. Forming the through-via of operation 920 includes forming the through-via having a low thermal resistance interface to the first low thermal resistance structure in the first package layer. In some embodiments, forming the through-via of operation 920 includes forming a plurality of through-vias in one or more chip layers of the IC package. In some embodiments, forming the through-via of operation 920 includes forming a TIV of an InFO package.

In some embodiments, forming the through-via in the chip layer of the IC package of operation 920 includes forming through-via 136 in chip layer 130 of package structure 100, described above with respect to FIG. 1.

At operation 930, a second low thermal resistance structure is formed in a second package layer of the IC package. Forming the second low thermal resistance structure in the second package layer of the IC package of operation 930 includes forming a low thermal resistance interface with the through-via. In some embodiments, forming the second low thermal resistance structure in the second package layer of the IC package of operation 930 includes forming a low thermal resistance interface with a heat spreader.

In some embodiments, forming the second low thermal resistance structure in the second package layer of the IC package of operation 930 includes forming a second low thermal resistance structure in a second package layer of an InFO package.

In some embodiments, forming the second low thermal resistance structure in the second package layer of the IC package of operation 930 includes forming second low thermal resistance structure 142 in second package layer 140 of package structure 100, described above with respect to FIG. 1.

Figure 10:
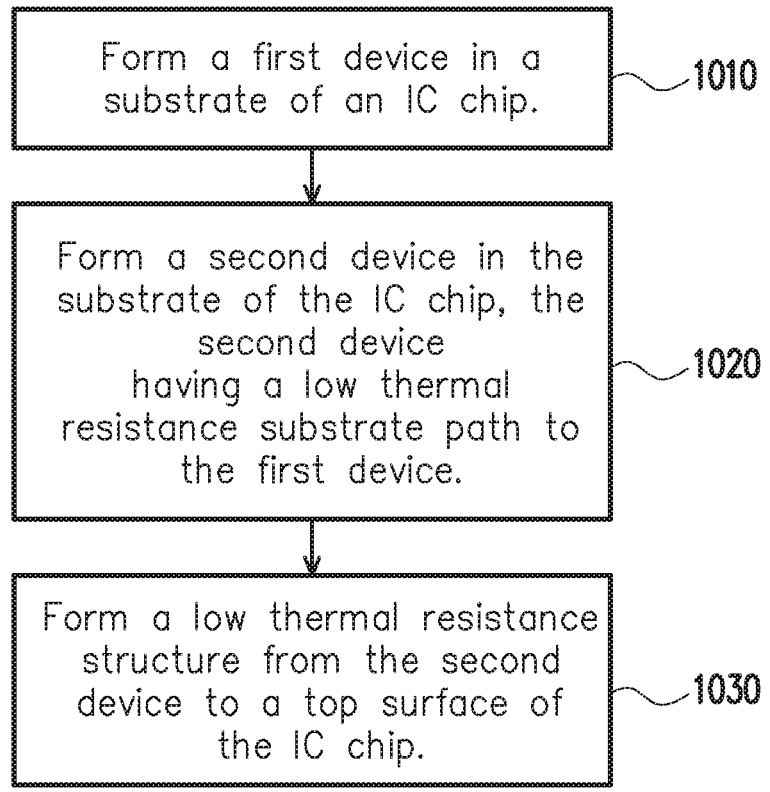
FIG. 10 is a flowchart of a method of forming an IC structure, in accordance with some embodiments.

FIG. 10 is a flowchart of a method 1000 of forming an IC structure, in accordance with one or more embodiments. Method 1000 is usable as operation 910, described above with respect to method 900 and FIG. 9. Method 1000 is implemented to manufacture an IC structure such as IC structure 200, described above with respect to FIG. 2, and thereby obtains the benefits described above with respect to IC structure 200.

The sequence in which the operations of method 1000 are depicted in FIG. 10 is for illustration only; the operations of method 1000 are capable of being executed in sequences that differ from that depicted in FIG. 10. In some embodiments, operations in addition to those depicted in FIG. 10 are performed before, between and/or after the operations depicted in FIG. 10.

At operation 1010, a first device is formed in a substrate of an IC chip. In some embodiments, forming the first device in the substrate of the IC chip of operation 1010 includes forming an electrical signal path that is electrically connected to the first device. In some embodiments, forming the first device in the substrate of the IC chip of operation 1010 includes forming first device 210 in substrate 200A, described above with respect to IC structure 200 and FIG. 2.

In some embodiments, forming the first device in the substrate of the IC chip of operation 1010 includes forming circuit components 410, described above with respect to IC structure 400 and FIG. 4.

At operation 1020, a second device is formed in the substrate of the IC chip. Forming the second device of operation 1020 includes forming the second device having a low thermal resistance substrate path to the first device. In some embodiments, forming the second device of operation 1020 includes forming a plurality of second devices, each second device of the plurality of second devices having a low thermal resistance substrate path to the first device.

In some embodiments, forming the second device in the substrate of the IC chip of operation 1020 includes forming second device 220 in substrate 200A, described above with respect to IC structure 200 and FIG. 2. In some embodiments, forming the second device in the substrate of the IC chip of operation 1020 includes forming substrate connections 530 and gate structure 540 in substrate 510, described above with respect to IC structure 500 and FIG. 5.

At operation 1030, a low thermal resistance structure is formed from the second device to a top surface of the IC chip. The low thermal resistance structure of operation 1030 is formed to provide a low thermal resistance path from the second device to the top surface of the IC. In some embodiments, forming the low thermal resistance path of operation 1030 includes forming the low thermal resistance path to be electrically isolated from an electrical signal path that is electrically connected to the first device. In some embodiments, forming the low thermal resistance structure of operation 1030 includes forming a plurality of low thermal resistance structures, each low thermal resistance structure of the plurality of low thermal resistance structures providing a low thermal resistance path from a second device to the top surface of the IC chip.

In some embodiments, forming the low thermal resistance structure from the second device to the top surface of the IC chip of operation 1030 includes forming low thermal resistance structure 222 from second device 220 to surface 200S, described above with respect to IC structure 200 and FIG. 2. In some embodiments, forming the low thermal resistance structure from the second device to the top surface of the IC chip of operation 1030 includes forming one or more of vertical heat sinks 301-305, described above with respect to IC structure 300 and FIG. 3.

In some embodiments, forming the low thermal resistance structure from the second device to the top surface of the IC chip of operation 1030 includes forming interconnect structure 550 from substrate connections 530 and gate structure 540 to pad structure 560, described above with respect to IC structure 500 and FIG. 5. In some embodiments, forming the low thermal resistance structure from the second device to the top surface of the IC chip of operation 1030 includes forming IC structure 600, described above with respect to FIG. 6.

Each of the various embodiments thereby establishes one or more low thermal resistance thermal paths that are separate from electrical signal paths and facilitate heat flow from locations at which heat is generated in IC circuits. By providing separate low thermal resistance paths, the various embodiments enable efficient power dissipation and small circuit sizes.

In some embodiments, a package structure comprises a first package layer comprising an electrical signal structure and a first thermal conduction structure electrically isolated from the electrical signal structure and a second package layer comprising a second thermal conduction structure. A chip layer positioned between the first package layer and the second package layer comprises an IC chip electrically connected to the electrical signal structure, a molding material, and a through-via positioned in the molding material. The first thermal conduction structure, the through-via, and the second thermal conduction structure are configured as a low thermal resistance path from the IC chip to a surface of the second package layer opposite the chip layer.

In some embodiments, a method of transferring heat in a package comprises conducting heat from an IC chip positioned in a chip layer of the package to a first package layer of the package, the first package layer being next to the chip layer. Heat from the first package layer of the package is conducted to a through-via positioned in the chip layer, and heat from the through-via is conducted to a surface of the second package layer opposite the chip layer. Conducting heat to the first package layer of the package comprises conducting heat to a first thermal conduction structure electrically isolated from electrical signal paths of the IC chip, the first thermal conduction structure positioned in the first package layer.

In some embodiments, an IC chip comprises a substrate comprising a first device and a second device, an electrical signal path from the first device to a top surface of the IC chip, and a low thermal resistance path extending from the second device to the top surface of the IC chip. The low thermal resistance path is electrically isolated from the electrical signal path, and the second device is thermally coupled to the first device by a low thermal resistance substrate path.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure comprising:
    a first package layer comprising an electrical signal structure and a first thermal conduction structure electrically isolated from the electrical signal structure;
    a second package layer comprising a second thermal conduction structure; and
    a chip layer positioned between the first package layer and the second package layer, the chip layer comprising:
        an integrated circuit (IC) chip electrically connected to the electrical signal structure;
        a molding material; and
        a through-via positioned in the molding material,
    wherein the first thermal conduction structure, the through-via, and the second thermal conduction structure are configured as a low thermal resistance path from the IC chip to a surface of the second package layer opposite the chip layer.

2. The package structure of claim 1, wherein
    the through-via is one through-via of a plurality of through-vias, and
    the low thermal resistance path from the IC chip to the surface of the second package layer includes the plurality of through-vias being configured in parallel.

3. The package structure of claim 1, wherein the first thermal conduction structure comprises redistribution lines.

4. The package structure of claim 1, wherein the second thermal conduction structure comprises redistribution lines.

5. The package structure of claim 1, further comprising a heat spreader positioned at the surface of the second package layer.

6. The package structure of claim 1, further comprising a printed circuit board electrically connected to the electrical signal structure.

7. The package structure of claim 1, wherein the IC chip comprises an on-chip thermal conduction structure having a low thermal resistance interface to the first thermal conduction structure.

8. The package structure of claim 1, wherein the IC chip and the electrical signal structure are part of an integrated voltage regulator.

9. The package structure of claim 1, wherein the electrical signal structure comprises an inductive device.

10. The package structure of claim 1, wherein the package structure is part of an integrated fan-out package.

11. The package structure of claim 1, wherein the IC chip comprises:
    a first device, and
    a second device.

12. A package structure comprising:
    a printed circuit board (PCB);
    a first package layer over the PCB, the first package layer comprising:
        an electrical signal structure electrically connected to the PCB; and
        a first thermal conduction structure electrically isolated from the electrical signal structure;
    a second package layer over the first package layer, the second package layer comprising a second thermal conduction structure electrically isolated from the electrical signal structure; and
    a chip layer positioned between the first package layer and the second package layer, the chip layer comprising:
        an integrated circuit (IC) chip electrically connected to the electrical signal structure;
        a molding material; and
        a set of through-vias positioned in the molding material and the second package layer,
    wherein the first thermal conduction structure, the set of through-vias, and the second thermal conduction structure are configured as a low thermal resistance path from the IC chip to a surface of the second package layer opposite the chip layer.

13. The package structure of claim 12, further comprising:
    a set of under-bump metallurgies (UBMs) positioned between the PCB and the electrical signal structure.

14. The package structure of claim 12, further comprising:
    a heat spreader positioned at the surface of the second package layer.

15. The package structure of claim 12, wherein
    the package structure is part of an integrated fan-out package,
    the first thermal conduction structure comprises a first set of post-passivation interconnect (PPI) structures, and
    the second thermal conduction structure comprises a second set of PPI structures.

* * * * *